(12) United States Patent
Kim et al.

(10) Patent No.: US 11,887,673 B2
(45) Date of Patent: Jan. 30, 2024

(54) MEMORY DEVICE FOR PERFORMING READ OPERATION AND METHOD OF OPERATING THE SAME

(71) Applicant: SK hynix Inc., Icheon-si (KR)

(72) Inventors: Jong Woo Kim, Icheon-si (KR); Young Cheol Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 90 days.

(21) Appl. No.: 17/575,274

(22) Filed: Jan. 13, 2022

(65) Prior Publication Data

US 2023/0044073 A1    Feb. 9, 2023

(30) Foreign Application Priority Data

Aug. 3, 2021    (KR) ........................ 10-2021-0101750

(51) Int. Cl.
| | |
|---|---|
| *G11C 16/26* | (2006.01) |
| *G11C 16/08* | (2006.01) |
| *G11C 16/34* | (2006.01) |
| *G11C 16/14* | (2006.01) |
| *G11C 16/04* | (2006.01) |

(52) U.S. Cl.
CPC .......... *G11C 16/26* (2013.01); *G11C 16/0483* (2013.01); *G11C 16/08* (2013.01); *G11C 16/14* (2013.01); *G11C 16/3459* (2013.01)

(58) Field of Classification Search
CPC ..... G11C 16/26; G11C 16/0483; G11C 16/08; G11C 16/14; G11C 16/3459; G11C 13/004; G11C 2013/0057; G11C 11/5628; G11C 16/10; G11C 16/30

USPC ........................................ 365/230.05, 189.05
See application file for complete search history.

(56) References Cited

U.S. PATENT DOCUMENTS

| | | | |
|---|---|---|---|
| 2014/0010017 A1* | 1/2014 | Lee ................... | G11C 16/3454 |
| | | | 365/185.18 |
| 2019/0259430 A1* | 8/2019 | Lee ......................... | H10B 41/35 |
| 2021/0202012 A1* | 7/2021 | Han ...................... | G06F 11/1048 |
| 2021/0225856 A1* | 7/2021 | Zhou ................. | H01L 29/42328 |
| 2021/0366539 A1* | 11/2021 | Kim ....................... | G11C 16/26 |
| 2021/0389878 A1* | 12/2021 | Lindberg .............. | G06F 3/0611 |
| 2022/0165337 A1* | 5/2022 | Bhatia .................. | H03M 13/611 |

(Continued)

FOREIGN PATENT DOCUMENTS

| | | | | |
|---|---|---|---|---|
| DE | 102012104713 A1 * | 1/2013 | ............. | G11C 16/14 |
| KR | 1020140058738 A | 5/2014 | | |
| KR | 101727704 B1 | 4/2017 | | |

*Primary Examiner* — Michael T Tran
(74) *Attorney, Agent, or Firm* — William Park & Associates Ltd.

(57) ABSTRACT

The present technology relates to an electronic device. A memory device according to the present technology includes a plurality of memory cells connected to a word line, an operation controller configured to apply a first or a second read voltage to the word line and to obtain data that is stored in the plurality of memory cells through bit lines that are respectively connected to the plurality of memory cells, and a read voltage controller configured to control the operation controller to read the data that is stored in the plurality of memory cells by using the second read voltage, and to read the data that is stored in the plurality of memory cells by using the first read voltage according to the number of off cells that are counted based on the data that is read by using the second read voltage, in response to a read command.

20 Claims, 16 Drawing Sheets

(56) References Cited

U.S. PATENT DOCUMENTS

| | | | |
|---|---|---|---|
| 2022/0165341 A1* | 5/2022 | Pitner | G11C 16/14 |
| 2022/0180940 A1* | 6/2022 | Sharon | H01L 25/0657 |
| 2022/0189564 A1* | 6/2022 | Rayaprolu | G11C 11/54 |
| 2022/0208276 A1* | 6/2022 | Wu | G11C 16/0483 |
| 2022/0276836 A1* | 9/2022 | Tsukamoto | G11C 11/54 |
| 2022/0310195 A1* | 9/2022 | Pirovano | G11C 16/102 |
| 2023/0004293 A1* | 1/2023 | Okubo | G11C 13/00 |
| 2023/0097079 A1* | 3/2023 | Fantini | G11C 13/0069 365/163 |

* cited by examiner

| READ VOLTAGE CODE STORAGE | | 152 |
|---|---|---|
| READ VOLTAGE(V_R) | VOLTAGE CODE(V_CODE) | |
| FIRST READ VOLTAGE(V1_R) | NUMBER OF OFF CELLS<REFERENCE OFF CELL NUMBER | |
| SECOND READ VOLTAGE(V2_R) | NUMBER OF OFF CELLS>REFERENCE OFF CELL NUMBER | |

MEMORY DEVICE FOR PERFORMING READ OPERATION AND METHOD OF OPERATING THE SAME

CROSS-REFERENCE TO RELATED APPLICATION

The present application claims priority under 35 U.S.C. § 119(a) to Korean patent application number 10-2021-0101750, filed on Aug. 3, 2021, in the Korean Intellectual Property Office, the entire disclosure of which is incorporated herein by reference.

BACKGROUND

1. Technical Field

The present disclosure relates to an electronic device, and more particularly, to a memory device for performing a read operation, and a method of operating the same.

2. Related Art

A memory device (semiconductor memory device) is a memory device that is implemented by using a semiconductor such as silicon (Si), germanium (Ge), gallium arsenide (GaAs), or indium phosphide (InP). The memory device is largely classified into a volatile memory device and a nonvolatile memory device.

The volatile memory device is a memory device in which stored data is lost when power supply is cut off. The volatile memory device includes a static RAM (SRAM), a dynamic RAM (DRAM), a synchronous DRAM (SDRAM), and the like. The nonvolatile memory device is a memory device that maintains stored data even though power supply is cut off. The nonvolatile memory device includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is largely classified into a NOR type and a NAND type.

SUMMARY

According to an embodiment of the present disclosure, a memory device includes a plurality of memory cells connected to a word line, an operation controller configured to apply a first read voltage or a second read voltage to the word line and configured to obtain data that is stored in the plurality of memory cells through bit lines that are respectively connected to the plurality of memory cells, wherein the second read voltage is higher than the first read voltage, and a read voltage controller configured to control the operation controller to read the data that is stored in the plurality of memory cells by using the second read voltage and control the operation controller to read the data that is stored in the plurality of memory cells by using the first read voltage according to the number of off cells that are counted based on the data that is read by using the second read voltage, in response to a read command that provides instruction to read the data that is stored in the plurality of memory cells that are input from an external controller.

According to an embodiment of the present disclosure, a memory device includes a plurality of memory cells connected to a word line, an operation controller configured to perform a program operation that stores multi-page data, each including a plurality of bits in the plurality of memory cells, and configured to perform a read operation that obtains the multi-page data that is stored in the plurality of memory cells, the program operation including a first program step and a second program step, the multi-page data including a plurality of logical pages, and a read voltage controller configured to control the operation controller to determine whether a program step is performed up to the first program step or the second program step on the plurality of memory cells based on the number of 0s or 1s that are included in sensing data that is obtained by sensing data that is stored in the plurality of memory cells by using a second read voltage, in response to a read command that provides instruction to read a logical page among the plurality of logical pages, and configured to sense the data that is stored in the plurality of memory cells by using a first read voltage with a voltage that is lower than the second read voltage when a program step of the plurality of memory cells is the first program step.

According to an embodiment of the present disclosure, a method of operating a memory device for reading data that is stored in memory cells by using a first read voltage or a second read voltage includes reading the data that is stored in the memory cells by using the second read voltage, counting the number of off cells among the memory cells by using the second read voltage, and reading the data that is stored in the memory cells by using the first read voltage with a voltage that is lower than the second read voltage based on the number of off cells that are counted.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a memory device for performing a read operation with an improved read speed, and a method of operating the same.

According to an embodiment of the present disclosure, a memory device for performing a read operation with an improved read speed, and a method of operating the same are provided.

Figure 1:
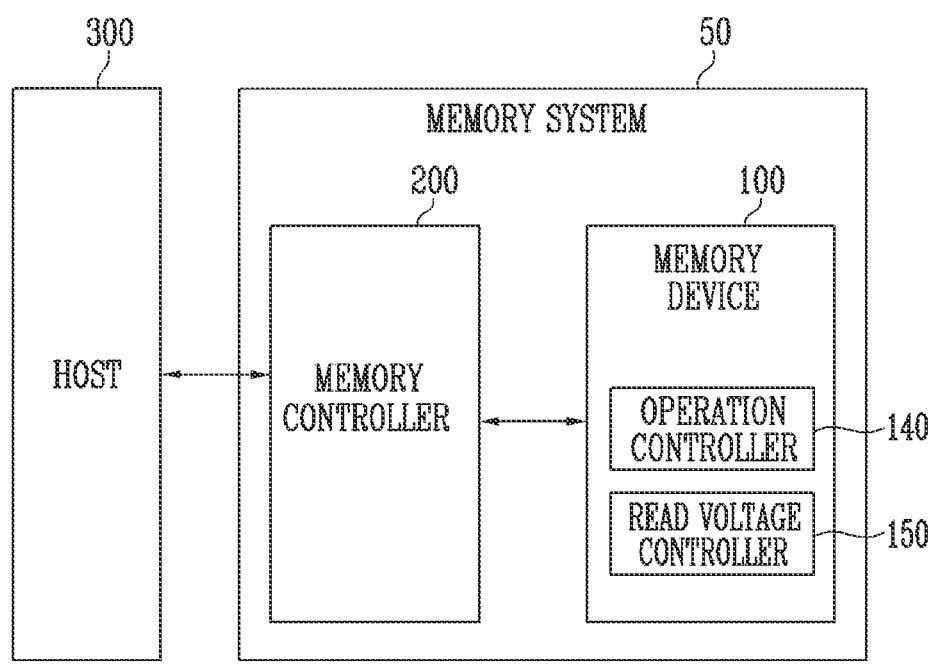
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, the memory system 50 may include a memory device 100 and a memory controller 200. The memory system 50 may be a device that stores data based on the instructions of a host 300, such as a cellular phone, a smartphone, an MP3 player, a laptop computer, a desktop computer, a game player, a TV, a tablet PC, or an in-vehicle infotainment system.

The memory system 50 may be manufactured as one of various types of storage devices according to a host interface that is a communication method with the host 300. For example, the memory system 50 may be configured as any one of various types of storage devices, such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The memory system 50 may be manufactured as any one of various types of packages. For example, the memory system 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates based on the memory controller 200. The memory device 100 may include a memory cell array (not shown) with a plurality of memory cells that store data.

Each of the memory cells may be configured as a single level cell (SLC) that stores data of one bit, a multi-level cell (MLC) that stores data of two bits, a triple level cell (TLC) that stores data of three bits, or a quad level cell (QLC) that is capable of storing data of four bits.

The memory cell array (not shown) may include a plurality of memory blocks. Each memory block may include a plurality of memory cells. One memory block may include a plurality of pages. In an embodiment, the page may be a unit for storing data in the memory device 100 or reading data that is stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area that is selected by the address in the memory cell array. The command may instruct the memory device 100 to perform an operation on the area that is selected by the address. For example, the memory device 100 may perform a write operation (program operation), a read operation, and an erase operation. During the write operation, the memory device 100 may program data in the area that is selected by the address. During the read operation, the memory device 100 may read data from the area that is selected by the address. During the erase operation, the memory device 100 may erase data that is stored in the area that is selected by the address.

In an embodiment, the memory device 100 may include an operation controller 140 and a read voltage controller 150.

The operation controller 140 may control the program operation and the read operation of the memory device 100. The program operation may be an operation that stores data in the memory cells that are included in the memory device 100. The read operation may be an operation that obtains the data that is stored in the memory cells.

Specifically, the program operation may be an operation that increases a threshold voltage of the memory cell according to data to be stored in the memory cell. In the present specification, the disclosure is described under an assumption that the memory cell is programmed with the TLC that stores data of three bits. When the program operation is performed, each of the memory cells may have a threshold voltage that corresponds to any one of an erase state and first to seventh program states. The threshold voltage of the memory cells after the program operation is performed may be determined according to the data to be stored in the memory cells. Each of the memory cells may have any one of the erase state and the first to seventh program states as a target program state according to the data to be stored.

In an embodiment, the program operation may include a first program step and a second program step. The memory cells may be programmed to have a threshold voltage that corresponds to any one of the erase state or an intermediate state through the first program step. Thereafter, each of the memory cells may be programmed to have the threshold voltage that corresponds to the target program state through the second program step.

In an embodiment, when each of the memory cells is programmed with the TLC that stores data of three bits, data that is stored in one page may be multi-page data. For example, the multi-page data may include a plurality of logical pages. Specifically, the plurality of logical pages may include a least significant bit (LSB) page, a central significant bit (CSB) page, and a most significant bit (MSB) page.

In an embodiment, the read operation may be an operation that applies a read voltage to the memory cells in which the data is stored and sensing the data that is stored in the memory cells in a state in which the read voltage is applied. The read operation may be an operation that obtains the data that is stored in the memory cells. Since the threshold voltage of the memory cells is determined according to the stored data, the read operation may be an operation that identifies a state of the threshold voltage of each of the memory cells. For example, when the memory cells are programmed with the TLC, seven read voltages may be applied to identify the state that corresponds to the threshold voltage among the erase state and the first to seventh program states.

Among the memory cells to which the read voltage is applied, a memory cell with a threshold voltage that is lower than the read voltage may be read as an on cell. The on cell may correspond to a logical value '1'. Among the memory cells to which the read voltage is applied, a memory cell with a threshold voltage that is higher than the read voltage may be read as an off cell. The off cell may correspond to a logical value '0'.

In an embodiment, the first program step and the second program step may be separately performed for each of a plurality of word lines that connects the plurality of memory cells. For example, a plurality of memory cells that are connected to a selected word line among the plurality of word lines may be programmed to the first program step. Thereafter, a plurality of memory cells that are connected to a next word line of the selected word line may be programmed to the first program step. Next, a plurality of memory cells that are connected to the selected word line may be programmed to the second program step. The program operation of the plurality of memory cells that are connected to the selected word line may be completed through the above-described sequence. However, the plurality of memory cells that are connected to the next word line of the selected word line might not be programmed to the second program step. In addition, the program operation may be simultaneously performed for each of the plurality of memory blocks with the plurality of memory cells. Therefore, the plurality of memory cells that are included in each of the memory blocks may exist in a state in which only the first program step is programmed or a state in which the program step is performed up to the second program step, a mixture of memory cells in a first program step and memory cells in a second program state.

In an embodiment, the operation controller 140 may generate a first read voltage or a second read voltage and may apply the first read voltage or the second read voltage to the word line to which the plurality of memory cells are connected. The first read voltage may be a voltage for reading the data that is stored in the plurality of memory cells programmed to the first program step. The second read voltage may be a voltage for reading any one of the plurality of logical pages that are stored in the plurality of memory cells programmed to the second program step. For example, the second read voltage may be a voltage for reading the LSB page among the plurality of logical pages.

In an embodiment, the second program step may be performed on the memory cells on which only the first program step is performed. At this time, a voltage to be applied to obtain the data that is stored in the memory cells on which only the first program step is performed may be the first read voltage. In addition, when the second read voltage is applied to the plurality of memory cells, the number of off cells of the memory cells on which only the first program step is performed and the memory cells on which the program up to the second program step is performed may be different. Therefore, the performed program step may be determine based on the number of off cells of the plurality of memory cells to which the second read voltage is applied.

In an embodiment, the operation controller 140 may read the data that is stored in the plurality of memory cells by using the second read voltage. In addition, the operation controller 140 may provide the data that is read to the read voltage controller 150 by using the second read voltage.

In an embodiment, the read voltage controller 150 may control the operation controller 140 to change the read voltage to be applied to the word line to which the plurality of memory cells are connected. For example, the memory cells on which only the first program step is programmed may have to perform a read operation by the first read voltage.

In an embodiment, the read voltage controller 150 may control the operation controller 140 to change the second read voltage to the first read voltage based on the number of off cells among the plurality of memory cells that are read by using the second read voltage and information regarding a reference off cell number. The information regarding the reference off cell number may be information that is compared to the number of off cells among the plurality of memory cells that are read by using the second read voltage and the reference to determine whether the number of off cells among the plurality of memory cells that are read by using the second read voltage exceeds the reference off cell number. The information regarding the reference off cell number may include a first reference off cell number and a second reference off cell number. For example, the read voltage controller 150 may control the operation controller 140 to change the second read voltage to the first read voltage when the number of off cells among the plurality of memory cells to which the second read voltage is applied is equal to or less than a preset first reference off cell number.

The memory controller 200 may control an overall operation of the memory system 50.

When power is applied to the memory system 50, the memory controller 200 may execute firmware (FW). When the memory device 100 is a flash memory device, the firmware (FW) may include a host interface layer (HIL) that controls the communication with the host 300, a flash translation layer (FTL) that controls the communication between the host 300 and the memory device 100, and a flash interface layer (FIL) that controls the communication with the memory device 100.

In an embodiment, the memory controller 200 may receive data and a logical block address (LBA) from the host 300 and may convert the LBA into a physical block address (PBA) that indicates an address of memory cells in which data that is included in the memory device 100 is to be stored. In the present specification, the LBA and a "logic address" or a "logical address" may be used as the same meaning. In the present specification, the PBA and a "physical address" may be used as the same meaning.

The memory controller 200 may control the memory device 100 to perform the write operation, the read operation, the erase operation, or the like according to the request of the host 300. During the write operation, the memory controller 200 may provide a write command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data independently regardless of the request from the host 300 and may transmit the command, the address, and the data to the memory device 100. For example, the memory controller 200 may provide the command, the address, and the data for performing the read operation and the write operations that accompany wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 300 may communicate with the memory system 50 by using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Meanwhile, in the related art, the memory controller 200 controls the memory device 100 to determine up to which program step is performed on the plurality of memory cells. This case may require a time that is longer than that of determining up to which program step is performed on the plurality of memory cells in the memory device 100.

Therefore, according to an embodiment of the present disclosure, data may be read at an improved speed by determining the program step based on the number of off cells among the plurality of memory cells in the memory device 100 by using the second read voltage.

Figure 2:
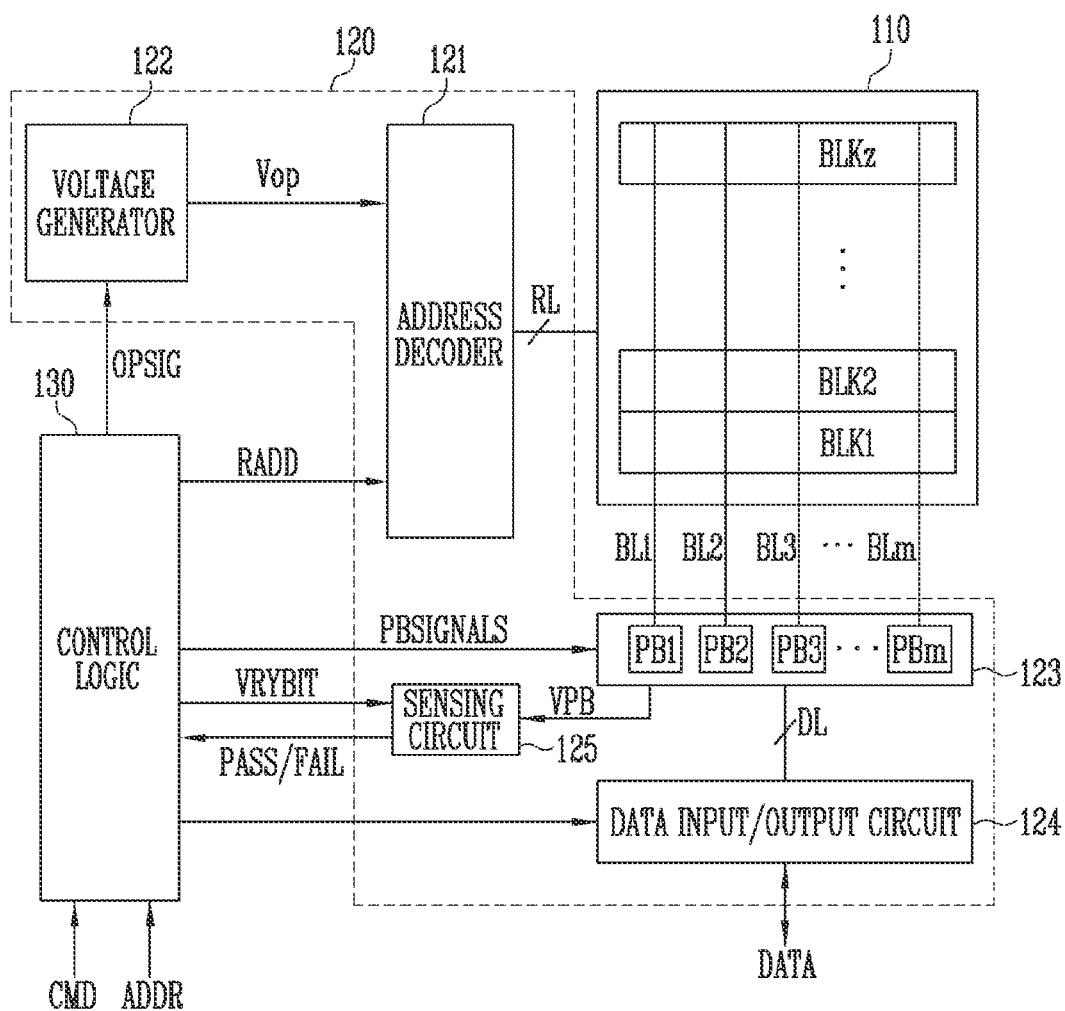
FIG. 2 is a diagram illustrating a structure of the memory device of FIG. 1.

FIG. 2 is a diagram illustrating a structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells. As an embodiment, the plurality of memory cells may be non-volatile memory cells. Memory cells connected to the same word line among the plurality of memory cells may be defined as one page. That is, the memory cell array 110 may be configured of a plurality of pages. According to an embodiment of the present disclosure, each of the plurality of memory blocks BLK1 to BLKz that is included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as an SLC that stores data of one bit, an MLC that stores data of two bits, a TLC that stores data of three bits, or a QLC that is capable of storing data of four bits.

The peripheral circuit 120 may include an address decoder 121, a voltage generator 122, the page buffer group 123, a data input/output circuit 124, and a sensing circuit 125.

The peripheral circuit 120 may drive the memory cell array 110. For example, the peripheral circuit 120 may drive the memory cell array 110 to perform a program operation, a read operation, and an erase operation. The operation controller 140, shown in FIG. 1, may be implemented as one configuration of the peripheral circuit 120 of FIG. 2.

The address decoder 121 may be connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 may be configured to operate in response to control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address RADD of the received address ADDR. The address decoder 121 may select at least one word line of the selected memory block by applying voltages that are provided from the voltage generator 122 to at least one word line WL according to the decoded row address RADD.

During the program operation, the address decoder 121 may apply a program voltage to a selected word line and may apply a pass voltage with a level less than that of the program voltage to unselected word lines. During a program verify operation, the address decoder 121 may apply a verify voltage to the selected word line and may apply a verify pass voltage with a level that is greater than that of the verify voltage to the unselected word lines.

During the read operation, the address decoder 121 may apply a read voltage to the selected word line and may apply a read pass voltage with a level that is greater than that of the read voltage to the unselected word lines.

The erase operation of the memory device 100 may be performed in memory block units. The address ADDR that is input to the memory device 100 during the erase operation may include a block address. The address decoder 121 may decode the block address and select one memory block according to the decoded block address. During the erase operation, the address decoder 121 may apply a ground voltage to the word lines, input to the selected memory block.

According to an embodiment of the present disclosure, the address decoder 121 may be configured to decode a column address of the transferred address ADDR. The decoded column address may be transferred to the page buffer group 123. As an example, the address decoder 121 may include a component, such as a row decoder, a column decoder, and an address buffer.

The voltage generator 122 may be configured to generate a plurality of operation voltages Vop by using an external power voltage that is supplied to the memory device 100. The voltage generator 122 may operate in response to the control logic 130.

As an example, the voltage generator 122 may generate an internal power voltage by regulating the external power voltage. The internal power voltage that is generated by the voltage generator 122 may be used as an operation voltage of the memory device 100.

As an embodiment, the voltage generator 122 may generate the plurality of operation voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop with various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The page buffer group 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control of the control logic 130.

The first to m-th page buffers PB1 to PBm may communicate data DATA with the data input/output circuit 124. At a time of program, the first to m-th page buffers PB1 to PBm may receive the data DATA to be stored through the data input/output circuit 124 and data lines DL.

During the program operation, when a program pulse is applied to the selected word line, the first to m-th page buffers PB1 to PBm may transfer the data DATA to be stored, that is, the data DATA that is received through the data input/output circuit 124 to the selected memory cells through the bit lines BL1 to BLm. The memory cells of the selected page may be programmed according to the transferred data DATA. A memory cell that is connected to a bit line to which a program allowable voltage (for example, a ground voltage) is applied may have an increased threshold voltage. A threshold voltage of a memory cell that is connected to a bit line to which a program inhibit voltage (for example, a power voltage) is applied may be maintained. During the program verify operation, the first to m-th page buffers PB1 to PBm may read the data DATA that is stored in the memory cells from the selected memory cells through the bit lines BL1 to BLm.

During the read operation, the page buffer group 123 may read the data DATA from the memory cells of the selected page through the bit lines BL and may store the read data DATA in the first to m-th page buffers PB1 to PBm.

During the erase operation, the page buffer group 123 may float the bit lines BL. As an embodiment, the page buffer group 123 may include a column selection circuit.

In an embodiment, while data that is stored in some of the page buffers among the plurality of page buffers that are included in the page buffer group 123 is being programmed in the memory cell array 110, other page buffers may receive new data from the memory controller 200 and store the new data.

The data input/output circuit 124 may be connected to the first to m-th page buffers PB1 to PBm through the data lines DL. The data input/output circuit 124 may operate in response to the control logic 130.

The data input/output circuit 124 may include a plurality of input/output buffers (not shown) that receive input data DATA. During the program operation, the data input/output circuit 124 may receive the data DATA to be stored from an external controller (not shown). During the read operation, the data input/output circuit 124 may output the data DATA that is transferred from the first to m-th page buffers PB1 to PBm that are included in the page buffer group 123 to the external controller.

During the read operation or the verify operation, the sensing circuit 125 may generate a reference current in response to a signal of an allowable bit VRYBIT generated by the control logic 130 and may compare a sensing voltage VPB received from the page buffer group 123 with a reference voltage that is generated by the reference current to output a pass signal or a fail signal to the control logic 130.

The control logic 130 may be connected to the address decoder 121, the voltage generator 122, the page buffer group 123, the data input/output circuit 124, and the sensing circuit 125. The control logic 130 may be configured to control all operations of the memory device 100. The control logic 130 may operate in response to a command CMD that is transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the allowable bit VRYBIT in response to the command CMD and the address ADDR. The control logic 130 may output the operation signal OPSIG to the voltage generator 122, output the row address RADD to the address decoder 121, output the read and write circuit control signal PBSIGNALS to the page buffer group 123, and output the allowable bit VRYBIT to the sensing circuit 125. In addition, the control logic 130 may determine whether the verify operation is passed or failed in response to the pass or fail signal PASS/FAIL that is output by the sensing circuit 125. The read voltage controller 150 shown in FIG. 1 may be implemented as one configuration of the control logic 130, shown in FIG. 2. In an embodiment, the control logic 130 may control the peripheral circuit 120 to change the second read voltage to the first read voltage and may apply the first read voltage to the plurality of memory cells.

Figure 3:
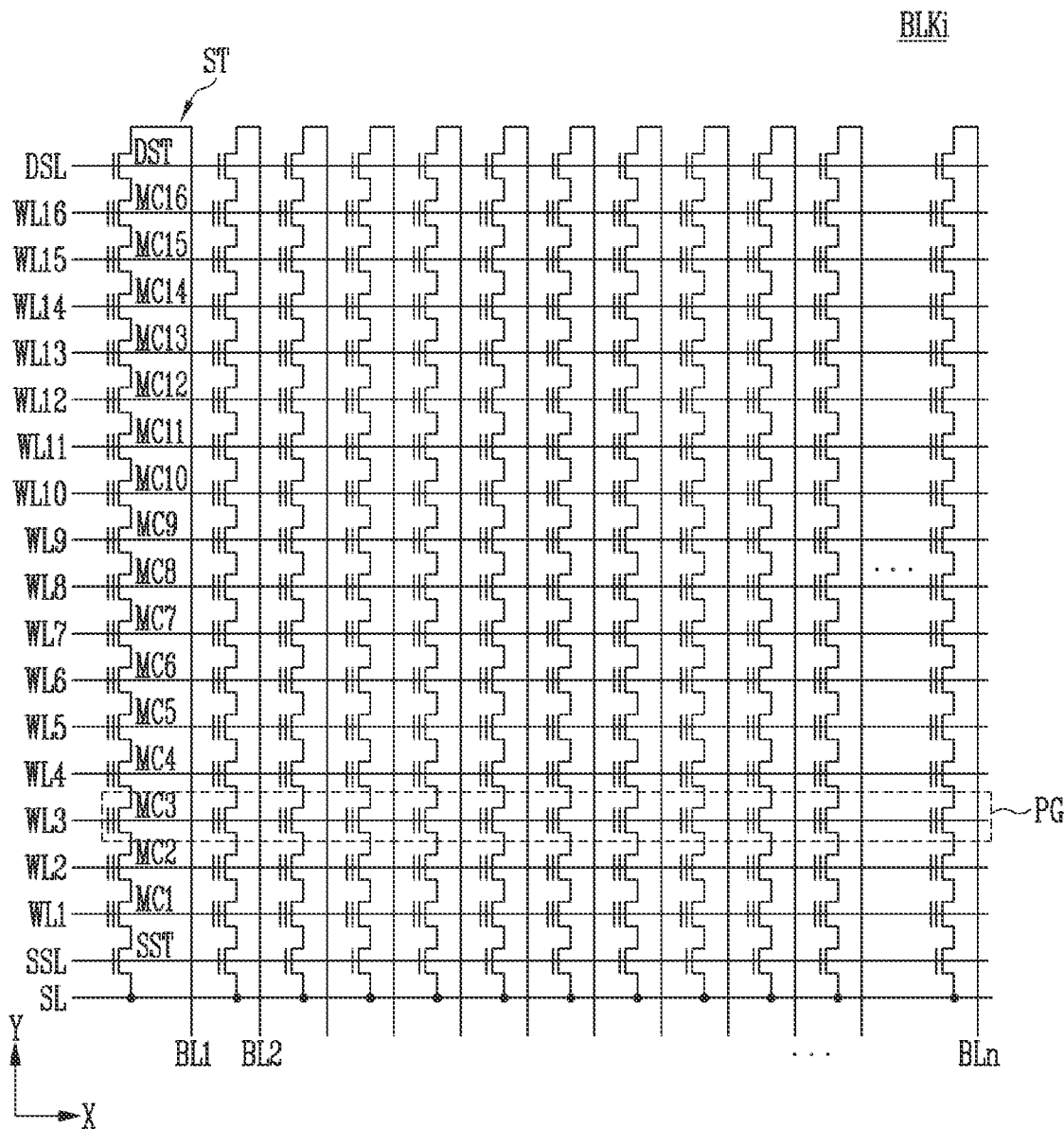
FIG. 3 is a diagram illustrating a configuration of any one memory block among plurality of memory blocks BLK1 to BLKi of FIG. 2.

FIG. 3 is a diagram illustrating a configuration of any one memory block among the plurality of memory blocks BLK1 to BLKi of FIG. 2.

The memory block BLKi is any one memory block BLKi among the memory blocks BLK1 to BLKz of FIG. 2.

Referring to FIG. 3, a plurality of word lines that are arranged in parallel with each other may be connected between a first select line and a second select line. Here, the first select line may be a source select line SSL, and the second select line may be a drain select line DSL. More specifically, the memory block BLKi may include a plurality of strings ST that are connected between the bit lines BL1 to BLn and the source line SL. The bit lines BL1 to BLn may be connected to the strings ST, respectively, and the source line SL may be commonly connected to the strings ST. Since the strings ST may be configured identically to each other, a string ST that is connected to the first bit line BL1 may be specifically described as an example.

The string ST may include a source select transistor SST, a plurality of memory cells MC1 to MC16, and a drain select transistor DST that are connected in series between the source line SL and the first bit line BL1. However, the number of source select transistors SST, drain select transistors DST, and memory cells MC1 to MC16 may vary based on the embodiment.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST that are included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells among the memory cells, included in different strings ST, connected to the same word line, may be referred to as a page PG. Therefore, the memory block BLKi may include the pages PG of the number of the word lines WL1 to WL16.

In an embodiment, one memory cell may store data of three bits. In this case, one physical page PG may store three logical page (LPG) data. The one logical page (LPG) data may include bit data of the same number as cells that are included in one physical page PG.

Figure 4:
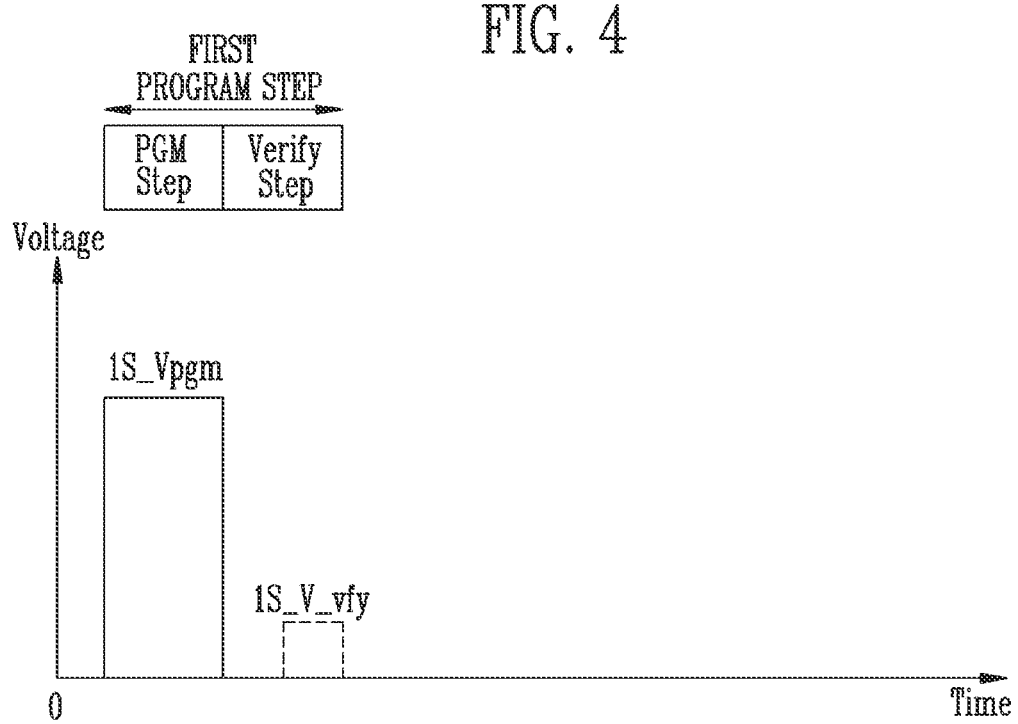
FIG. 4 is a diagram illustrating a first program step according to an embodiment of the present disclosure.

FIG. 4 is a diagram illustrating a first program step according to an embodiment of the present disclosure.

Referring to FIG. 4, the first program step may be a step of applying a first step program voltage 1S_Vpgm and a first step verify voltage 1S_V_vfy to memory cells in an initial state. The first program step may include a program voltage application step PGM Step and a program verify step Verify Step.

The program voltage may be applied to the selected word line to which the selected memory cells are connected in the program voltage application step PGM Step. Each of the selected memory cells may be programmed from the initial state to an intermediate program state in the program voltage application step PGM Step.

In the program verify step Verify Step, the verify voltage may be applied to the selected word line. It may be determined whether the selected memory cells are programmed to the intermediate program state through the bit lines respectively connected to the selected memory cells in a state in which the verify voltage is applied to the selected word line. However, the program verify step Verify Step may be omitted in the first program step.

In an embodiment, when the first program step is performed, the first step verify voltage 1S_V_vfy may be applied after the first step program voltage 1S_Vpgm is applied to the selected word line. The first step program voltage 1S_Vpgm may have a voltage level that is higher than that of the first program voltage that is applied to the selected word line in the second program step. It may be determined that memory cells on which the program verify operation is passed by the first step verify voltage 1S_V_vfy have the intermediate program state.

Figure 5:
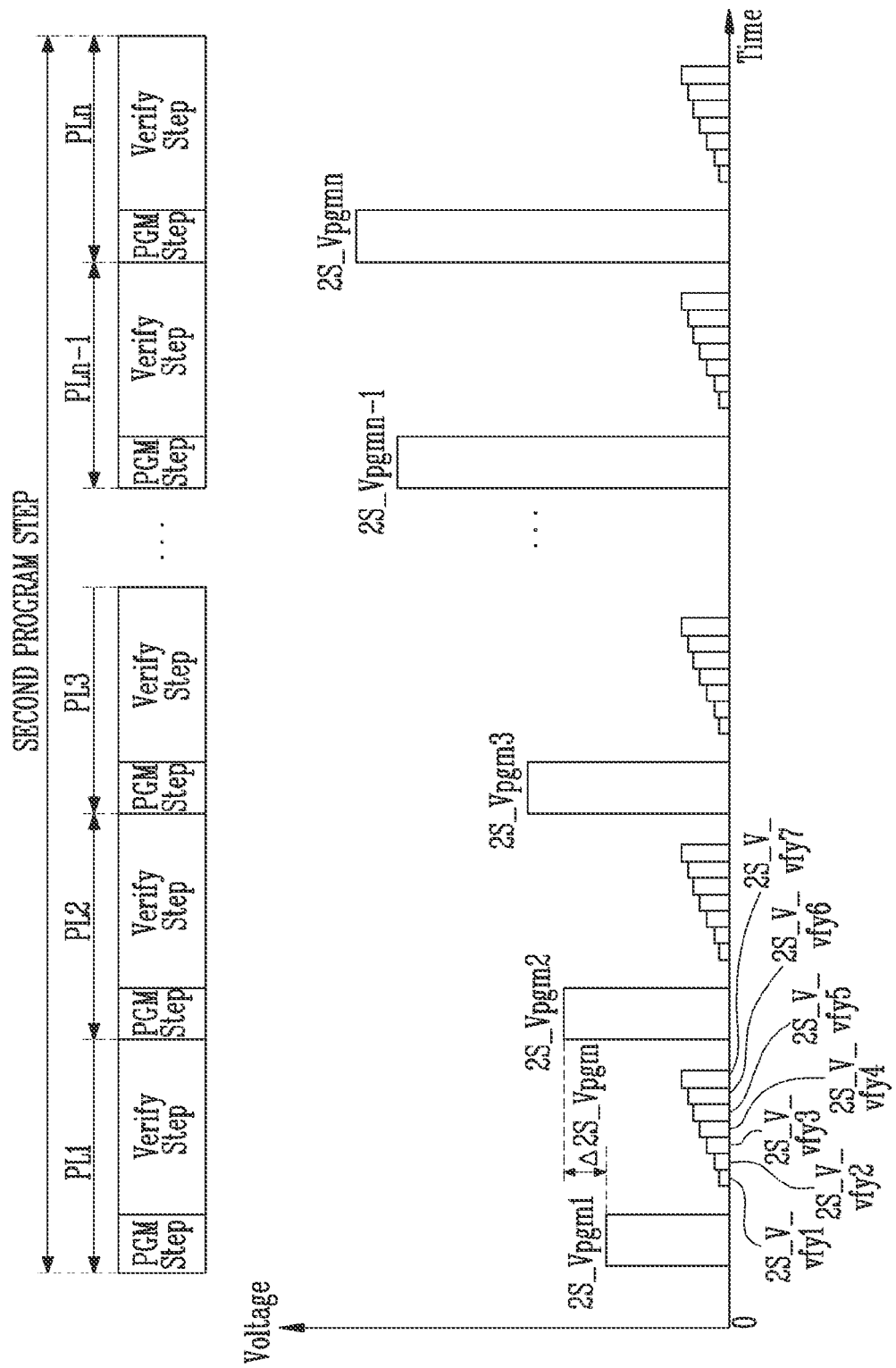
FIG. 5 is a diagram illustrating a second program step according to an embodiment of the present disclosure.

FIG. 5 is a diagram illustrating a second program step according to an embodiment of the present disclosure.

Referring to FIG. 5, the second program step may be a step of applying program voltages 2S_Vpgm1 to 2S_Vpgmn (n is a natural number equal to or greater than 1) and verify voltages 2S_V_vfy1 to 2S_V_vfy7 to the memory cells on which the first program step is performed. The second program step may include a plurality of program loops PL1 to PLn. The memory device 100 may perform the program operation so that the selected memory cells have a target program state among final program states by performing the plurality of program loops PL1 to PLn. Each of the plurality of program loops may include a program voltage application step PGM Step and a program verify step Verify Step.

The program voltage may be applied to the selected word line to which the selected memory cells are connected in the program voltage application step PGM Step. Each of the selected memory cells may be programmed to the target program state among the final program states in the program voltage application step PGM Step. The target program state may be determined according to data to be programmed to the selected memory cells.

The verify voltages may be applied to the selected word line in the program verify step Verify Step. It may be determined whether the selected memory cells are programmed to the target program state through the bit lines that are respectively connected to the selected memory cells in a state in which the verify voltage is applied to the selected word line.

In an embodiment, the program voltage may be determined according to an incremental step pulse programming (ISPP) method. The level of the program voltage may be gradually increased or decreased as the program loops PL1 to PLn are repeated. The number of times the program voltages that are used in each program loop are applied, a voltage level, a voltage application time, and the like may be determined in various forms according to the memory controller 200.

The pass voltage may be applied to the unselected word lines, the remaining word lines other than the selected word line. In an embodiment, the pass voltage with the same level may be applied to the unselected word lines. In an embodiment, the pass voltage may have different levels according to a position of the word line.

A ground voltage may be applied as the program allowable voltage to selected bit lines that are connected to the memory cell to be programmed. The program inhibit voltage may be applied to unselected bit lines that are bit lines that are connected to the memory cells other than the memory cells to be programmed.

In the program verify step Verify Step, the memory device 100 may apply the verify voltage to the selected word lines and may apply the verify pass voltage to the unselected word lines. The memory device 100 may sense a voltage or a current that is output through the bit lines to which the memory cells that are connected to the selected word line are respectively connected and may determine whether the program verify step Verify Step is passed or failed based on a sensed result.

In the program voltage application step PGM Step, the selected memory cells may be programmed to any one of the final program states.

For example, when the memory cells are programmed with a TLC, the selected memory cells may be programmed to any one of the erase state and the first to seventh program states. However, the number of data bits that are stored in the memory cell is not limited to the present embodiment.

In the program verify step Verify Step, it may be determined whether the selected memory cells are programmed to the target program state among the final program states. In the program verify step Verify Step, the verify voltage that corresponds to the target program state may be applied to the selected memory cells. For example, when the selected memory cells are read as the off cells by the verify voltage that corresponds to the target program state among the final program states, the program verify step Verify Step may be passed.

In an embodiment, when the first program loop PL1 is performed, the first to seventh verify voltages 2S_V_vfy1 to 2S_V_vfy7 may be sequentially applied after the first program voltage 2S_Vpgm1 is applied to the selected word line. At this time, the memory cells of which the target program state is the first program state may perform the program verify step Verify Step by using the first verify voltage 2S_V_vfy1. The memory cells of which the target program state is the second program state may perform the program verify step Verify Step by using the second verify voltage 2S_V_vfy2. The memory cells of which the target program state is the third program state may perform the program verify step Verify Step by using the third verify voltage 2S_V_vfy3. The memory cells of which the target program state is the fourth program state may perform the program verify step Verify Step by using the fourth verify voltage 2S_V_vfy4. The memory cells of which the target program state is the fifth program state may perform the program verify step Verify Step by using the fifth verify voltage 2S_V_vfy5. The memory cells of which the target program state is the sixth program state may perform the program verify step Verify Step by using the sixth verify voltage 2S_V_vfy6. The memory cells of which the target program state is the seventh program state may perform the program verify step Verify Step by using the seventh verify voltage 2S_V_vfy7. The number of verify voltages is not limited to the present embodiment.

It may be determined that the memory cells on which the program verify step Verify step is passed by each of the verify voltages 2S_V_vfy1 to 2S_V_vfy7 have the target program state. Thereafter, the memory cells on which the program verify step Verify step is passed may be program inhibited in the second program loop PL2. The program inhibit voltage may be applied to the bit line that is connected to the program inhibited memory cells.

It may be determined that the memory cells on which the program verify step Verify Step fails by each of the verify voltages 2S_V_vfy1 to 2S_V_vfy7 might not reach the target program state. Thereafter, the memory cells on which the program verify step Verify Step fails may perform the second program loop PL2.

The second program voltage 2S_Vpgm2 that is higher than the first program voltage 2S_Vpgm1 by a unit voltage Δ2S_Vpgm may be applied to the selected word line in the second program loop PL2. Thereafter, the program verify step Verify Step may be performed identically to the program verify step Verify Step of the first program loop PL1.

Thereafter, the second program step may perform a next program loop that is identical to the second program loop PL2 by a preset number of times.

In an embodiment, when the program operation is not completed within a program loop of a preset number of times, the program operation may be failed. When the program operation is completed within the program loop of the preset number of times, the program operation may be passed. Whether the program operation is completed may be determined by whether all program verify steps Verify Step on the selected memory cells are passed. When all program verify steps Verify Step are passed, the next program loop might not be performed.

Figure 6:
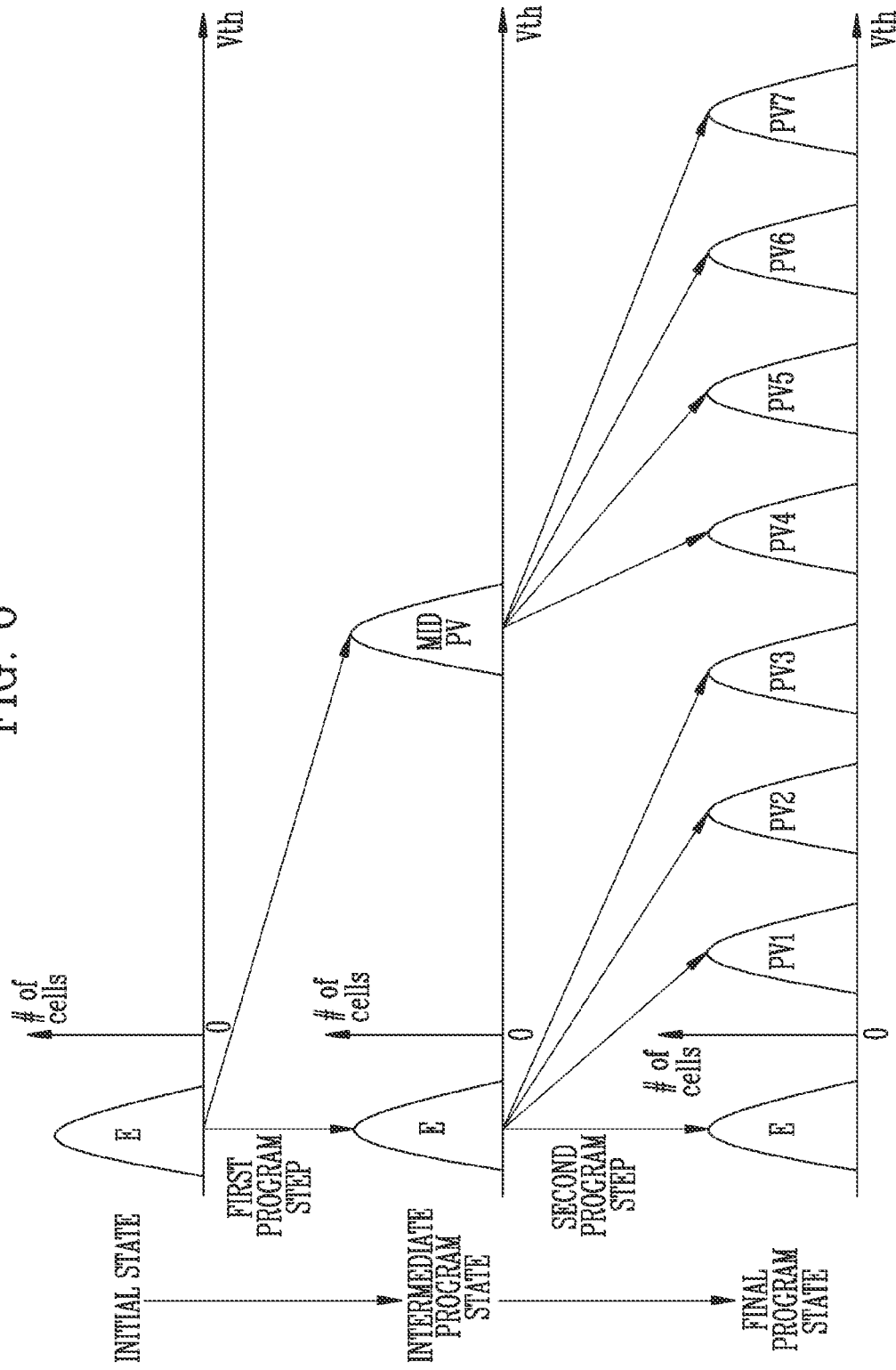
FIG. 6 is a diagram illustrating a threshold voltage distribution of memory cells changed according to a program step according to an embodiment of the present disclosure.

FIG. 6 is a diagram illustrating a threshold voltage distribution of memory cells changed according to a program step according to an embodiment of the present disclosure.

Referring to FIG. 6, the threshold voltage distribution of the memory cells may change in an order of the initial state, the intermediate program state, and the final program state according to the program operation.

The initial state may be a state in which the program operation is not performed, and the threshold voltage distribution of the memory cells may be an erase state E.

The intermediate program state may be the program state of the memory cells on which the first program step is performed. The threshold voltage of the memory cells may change to the erase state E or an intermediate state MID PV according to the first program step. For example, the memory cells with the threshold voltage of the erase state E in the initial state may have the threshold voltage that corresponds to the erase state E or the intermediate state MID PV according to the first program step.

The final program state may be the program state of the memory cells on the second program step is performed. The threshold voltage of the memory cells may change to the erase state E and first to seventh program states PV1 to PV7 according to the second program step. For example, in the intermediate program state, the memory cell with the threshold voltage of the erase state E may have the threshold voltage that corresponds to the erase state E, the first program state PV1, the second program state PV2, and the second program state PV3 according to the second program step. In the intermediate program state, the memory cells with the threshold voltage of the intermediate state MID PV may have the threshold voltage that corresponds to the fourth program state PV4, the fifth program state PV5, the sixth program state PV6, and the seventh program state PV7 according to the second program step.

Each of the memory cells may have any one of the erase state E and the first to seventh program states PV1 to PV7 as the target program state. The target program state may be determined according to the data to be stored in the memory cell. The memory cells may have the threshold voltage that corresponds to the target program state among the final program states according to the first program step and the second program step.

Figure 7:
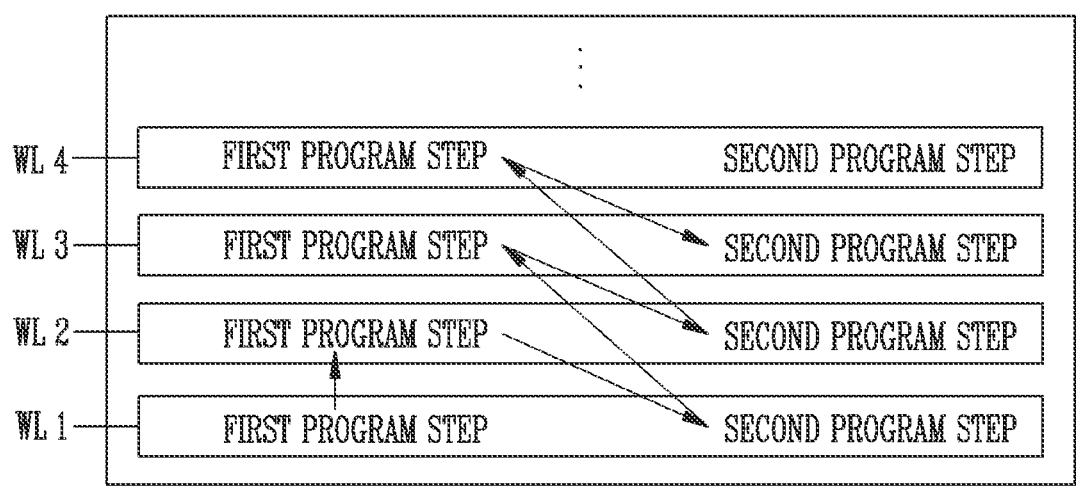
FIG. 7 is a diagram illustrating a program sequence between word lines according to an embodiment of the present disclosure.

FIG. 7 is a diagram illustrating a program sequence between word lines according to an embodiment of the present disclosure.

Referring to FIG. 7, the memory device 100 may perform the program operation on the memory cells that are connected to the word lines WL1 to WL4 in the memory block BLKz. The program operation may be performed by being divided into the first program step and the second program step.

In an embodiment, the first program step may be performed on the first word line WL1. Thereafter, the first program step may be performed on the second word line WL2. Thereafter, the second program step may be performed on the first word line WL1. Accordingly, the program operation of the first word line WL1 may be completed. For example, each of the memory cells that are connected to the first word line WL1 may be programmed to the target program state among the final program states. Thereafter, the sequence of the first program step and the second program step to be programmed on the word lines may be performed identically to the program sequence of the first word line WL1.

As described above, regarding the program sequence according to the present disclosure, the first program step may be performed on the selected word line, the first program step may be performed on the word line to be next selected, and the second program step may be performed on the selected word line. Such a program method may reduce an interference phenomenon between adjacent word lines compared to a method of performing a program operation on a selected word line without dividing a program step.

Figure 8:
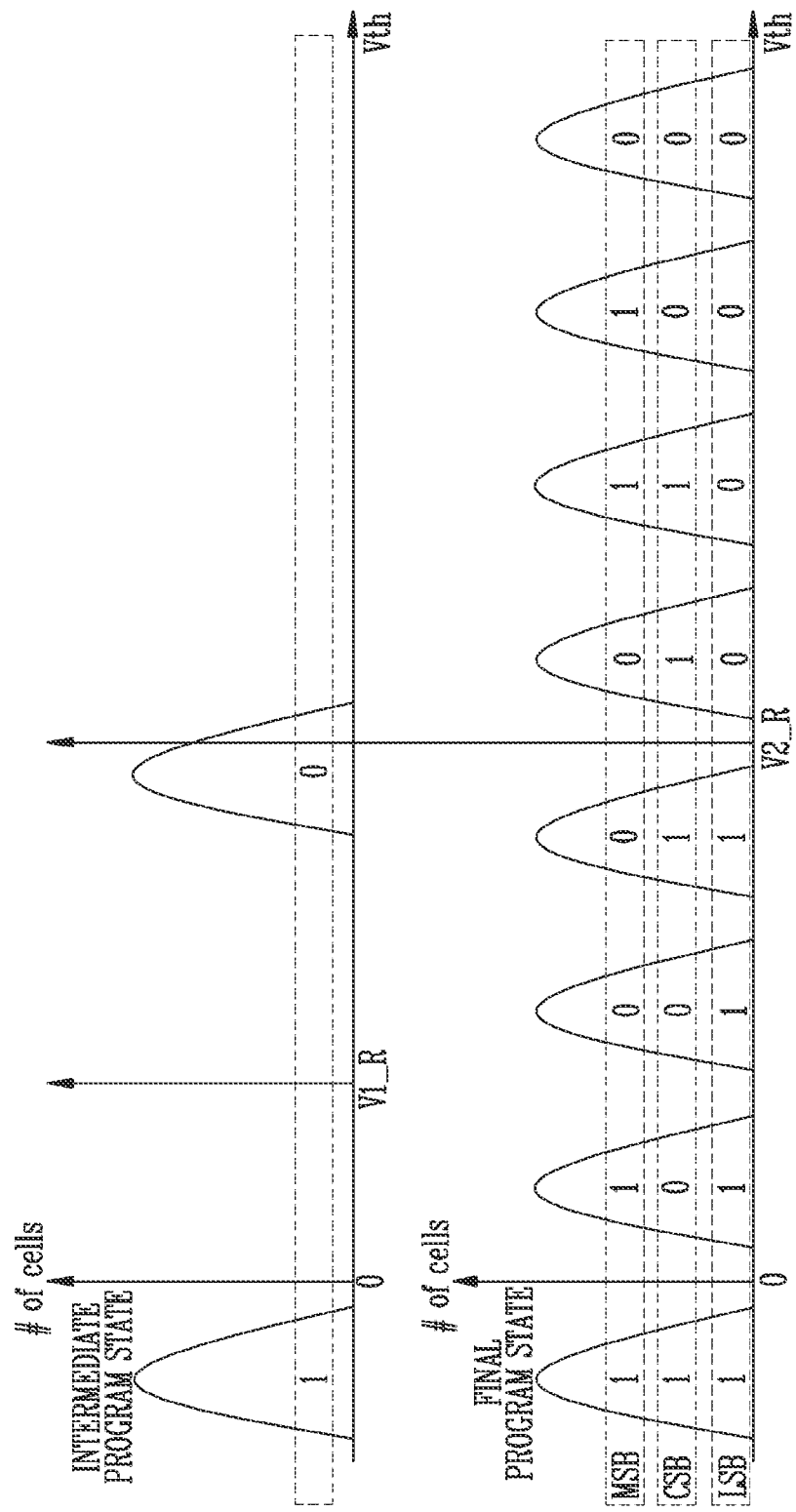
FIG. 8 is a diagram illustrating a threshold voltage distribution of memory cells storing data of at least one bit according to an embodiment of the present disclosure.

FIG. 8 is a diagram illustrating a threshold voltage distribution of memory cells storing data of at least one bit according to an embodiment of the present disclosure.

Referring to FIG. 8, the intermediate program state may be the program state of the memory cells on which the first program step is performed. In the intermediate program state, one memory cell may have the threshold voltage that corresponds to any one of the erase state E and the intermediate state MID PV. In the intermediate program state, one memory cell may store one data bit.

A first read voltage V1_R may be a read voltage for distinguishing between the erase state E and the intermediate state MID PV of the memory cells in the intermediate program state. The memory cell with the erase state E in the intermediate program state may be read as the on cell. The on cell may correspond to the logical value '1'. In the intermediate program state, the memory cell with the intermediate state MID PV may be read as the off cell. The off cell may correspond to the logical value '0'.

The final program state may be the program state of the memory cells on which the second program step is performed. In the final program state, one memory cell may have any one of the erase state E and the first program state PV1 to the seventh program state PV7. In the final program state, one memory cell may store data of a plurality of bits. In an embodiment, when one memory cell is programmed with a TLC, data that is stored in one page may be the multi-page data. For example, the multi-page data may include the plurality of logical pages. Specifically, the plurality of logical pages may include the LSB page, the CSB page, and the MSB page.

The second read voltage V2_R may be a read voltage for distinguishing among the erase state E, the first program state PV1 to the third program state PV3, and the fourth program state PV4 to the seventh program state PV7 of the memory cells in the final program state. At this time, the memory cells that correspond to the erase state E and the first program state PV1 to the third program state PV3 in the LSB page may be read as the on cell. The memory cells that correspond to the fourth program state PV4 to the seventh program state PV7 in the LSB page play be read as the off cell.

Figure 9:
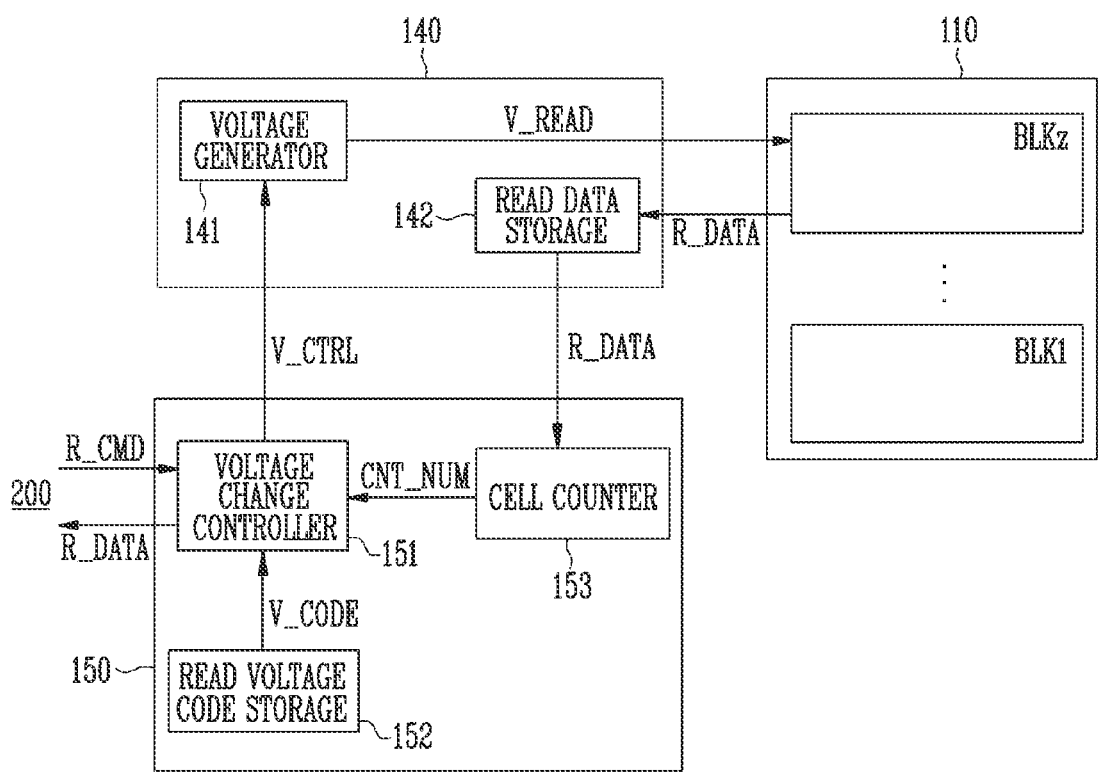
FIG. 9 is a diagram illustrating an operation that reads data by changing a second read voltage to a first read voltage according to an embodiment of the present disclosure.

FIG. 9 is a diagram illustrating an operation that reads data by changing a second read voltage to a first read voltage according to an embodiment of the present disclosure.

Referring to FIG. 9, the operation controller 140 may include a voltage generator 141 and a read data storage 142.

The read voltage controller 150 may include a voltage change controller 151, a read voltage code storage 152, and a cell counter 153. The voltage generator 141, shown in FIG. 9, may be implemented as one configuration of the voltage generator 122 shown in FIG. 2.

The memory controller 200 may provide a read command R_CMD that provides instruction to read the data that is stored in the plurality of memory cells to the voltage change controller 151.

The read voltage code storage 152 may provide a voltage code V_CODE that corresponds to the second read voltage to the voltage change controller 151.

The voltage change controller 151 may provide a control signal V_CTRL to the voltage generator 141 so that the voltage generator 141 generates the second read voltage in response to the read command R_CMD.

The voltage generator 141 may generate the second read voltage and apply the second read voltage to the plurality of memory cells in the memory cell array 110.

Thereafter, the read data storage 142 may store data R_DATA that is read by applying the second read voltage to the plurality of memory cells. The read data R_DATA may include a plurality of data chunks. In an embodiment, the read data storage 142 may provide the read data R_DATA to the cell counter 153. In another embodiment, the read data storage 142 may provide only one data chunk among the plurality of data chunks that are included in the read data to the cell counter 153.

The cell counter 153 may receive the read data R_DATA and count the number of off cells among the plurality of memory cells to which the second read voltage is applied. In an embodiment, the cell counter 153 may count only the number of off cells of the memory cells that correspond to the chunk among the plurality of memory cells to which the second read voltage is applied. In an embodiment, the cell counter 153 may count the number of 0s that are included in the read data R_DATA. In another embodiment, the cell counter 153 may count the number of is that are included in the read data R_DATA. The cell counter 153 may provide the counted number CNT_NUM of off cells to the voltage change controller 151.

The voltage change controller 151 may receive the voltage code V_CODE that corresponds to each of the first read voltage or the second read voltage and the information regarding the reference off cell number from the read voltage code storage 152. The information regarding the reference off cell number may include the first reference off cell number and the second reference off cell number.

The voltage change controller 151 may determine whether the counted number CNT_NUM of off cells exceeds the first reference off cell number. When the counted number CNT_NUM of off cells exceeds the preset first reference off cell number, the voltage change controller 151 may provide the read data R_DATA to the memory controller 200. On the contrary, when the counted number CNT_NUM of off cells is equal to or less than the preset first reference off cell number, the voltage change controller 151 may change the voltage code that corresponds to the second read voltage to the voltage code that corresponds to the first read voltage. Thereafter, the voltage change controller 151 may provide the control signal V_CTRL for generating the first read voltage through the voltage code that corresponds to the first read voltage to the voltage generator 141.

In an embodiment, the voltage change controller 151 may determine whether the number of off cells of the memory cells that correspond to the chunk among the plurality of memory cells that are read by applying the second read voltage exceeds the second reference off cell number. For example, when the number of off cells of the memory cells that correspond to the chunk is equal to or less than the second reference off cell number, the voltage change controller 151 may change the voltage code that corresponds to the second read voltage to the voltage code that corresponds to the first read voltage. Thereafter, the voltage change controller 151 may provide the control signal V_CTRL for generating the first read voltage through the voltage code that corresponds to the first read voltage to the voltage generator 141.

The voltage generator 141 may generate the first read voltage and apply the first read voltage to the plurality of memory cells in the memory cell array 110. The read data storage 142 may store the data R_DATA that is read by applying the first read voltage to the plurality of memory cells. Thereafter, the read data R_DATA may be provided to the memory controller 200 through the cell counter 153 and the voltage change controller 151.

In the present specification, an operation that changes the second read voltage to the first read voltage based on the number of off cells or the number of logical values '0' among the plurality of memory cells that are read by applying the second read voltage is described. However, a reference for changing the read voltage is not limited to the number of off cells or the number of logical values '0'. Alternatively, the second read voltage may be changed to the first read voltage based on the number of on cells or the number of logical values '1'.

Figures 10, 11:
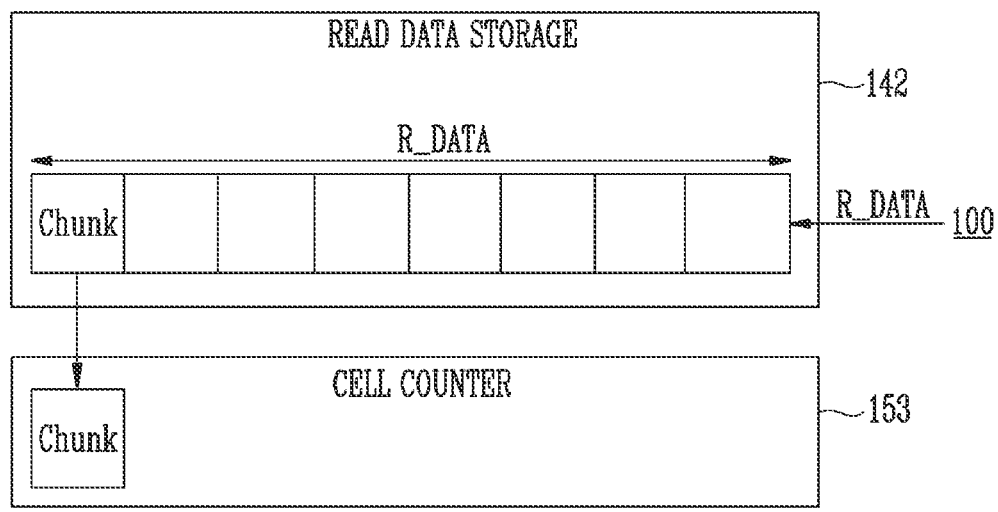
FIG. 10 is a diagram illustrating a voltage code corresponding to a read voltage according to an embodiment of the present disclosure.
FIG. 11 is a diagram illustrating an operation that moves a plurality of memory cells corresponding to a chunk to a cell counter according to an embodiment of the present disclosure.

FIG. 10 is a diagram illustrating a voltage code corresponding to a read voltage according to an embodiment of the present disclosure.

Referring to FIG. 10, the read voltage code storage 152 may store the voltage code that corresponds to each of the first read voltage and the second read voltage, and the information regarding the reference off cell number. The information regarding the reference off cell number may include the first reference off cell number and the second reference off cell number. The read voltage code storage 152 may provide the voltage code that corresponds to each of the first read voltage and the second read voltage and the information regarding the reference off cell number to the voltage change controller 151. In an embodiment, the voltage code that corresponds to each of the first read voltage and the second read voltage may be a read voltage level to be generated by the voltage generator 141, shown in FIG. 9.

The voltage change controller 151 may receive the voltage code that corresponds to each of the first read voltage and the second read voltage and the information regarding the reference off cell number. Thereafter, the voltage change controller 151 may change the voltage code that corresponds to the second read voltage to the voltage code that corresponds to the first read voltage. For example, when the number of off cells among the plurality of memory cells that are read by applying the second read voltage is equal to or less than the first reference off cell number, the voltage change controller 151 may change the voltage code that corresponds to the second read voltage to the voltage code that corresponds to the first read voltage. As another example, when the number of off cells that correspond to the chunk among the plurality of memory cells that are read by applying the second read voltage is equal to or less than the second reference off cell number, the voltage change controller 151 may change the voltage code that corresponds to the second read voltage to the voltage code that corresponds to the first read voltage.

FIG. 11 is a diagram illustrating an operation that moves a plurality of memory cells corresponding to a chunk to a cell counter according to an embodiment of the present disclosure.

Referring to FIG. 11, the read data storage 142 may store the data R_DATA that is read by applying the second read voltage to the plurality of memory cells. The read data R_DATA may include the plurality of data chunks. The read data storage 142 may provide the read data R_DATA to the cell counter 153. In an embodiment, the read data storage 142 may provide only one data chunk among the plurality of data chunks that are included in the read data to the cell counter 153. Thereafter, the read data storage 142 may provide the memory cells that correspond to the chunk among the plurality of memory cells to which the second read voltage is applied to the cell counter 153. The size of the chunk may be variously set. For example, the cell counter 153 may count only the number of off cells of the memory cells that correspond to the chunk.

Figure 12:
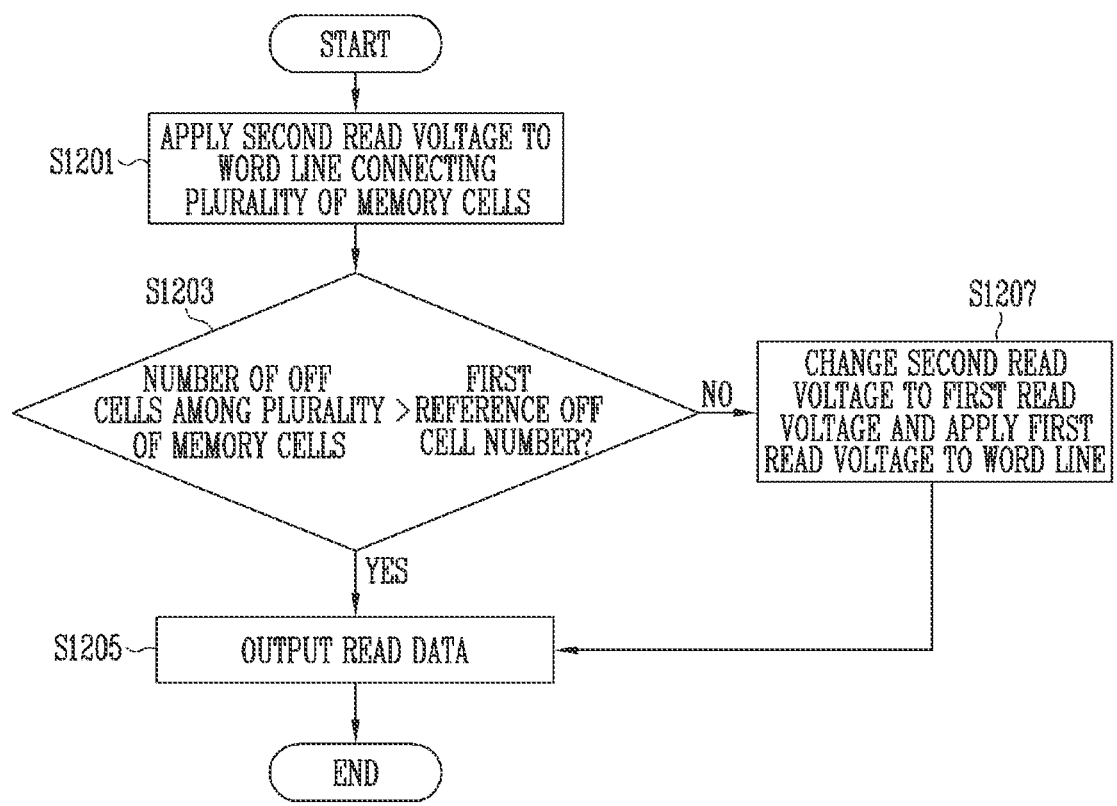
FIG. 12 is a flowchart illustrating a method of changing a second read voltage to a first read voltage according to an embodiment of the present disclosure.

FIG. 12 is a flowchart illustrating a method of changing a second read voltage to a first read voltage according to an embodiment of the present disclosure.

The method shown in FIG. 12 may be performed by, for example, the memory device 100 shown in FIG. 1.

Referring to FIG. 12, in step S1201, the memory device 100 may apply the second read voltage to the word line that connects the plurality of memory cells. For example, the operation controller 140 may store the data that is read by applying the second read voltage to the plurality of memory cells in the read data storage 142.

In step S1203, the memory device 100 may determine whether the number of off cells among the plurality of memory cells to which the second read voltage is applied exceeds the first reference off cell number. For example, when the number of off cells among the plurality of memory cells exceeds the first reference off cell number, step S1205 may be performed. Alternatively, when the number of off cells among the plurality of memory cells is equal to or less than the first reference off cell number, step S1207 may be performed.

In step S1205, the memory device 100 may output the data that is read by applying the second read voltage to the plurality of memory cells to the memory controller 200.

In step S1207, when the number of off cells among the plurality of memory cells is equal to or less than the first reference off cell number, the memory device 100 may change the second read voltage to the first read voltage and apply the first read voltage to the word line. Thereafter, the memory device 100 may output the data that is read by applying the first read voltage to the plurality of memory cells to the memory controller 200.

Figure 13:
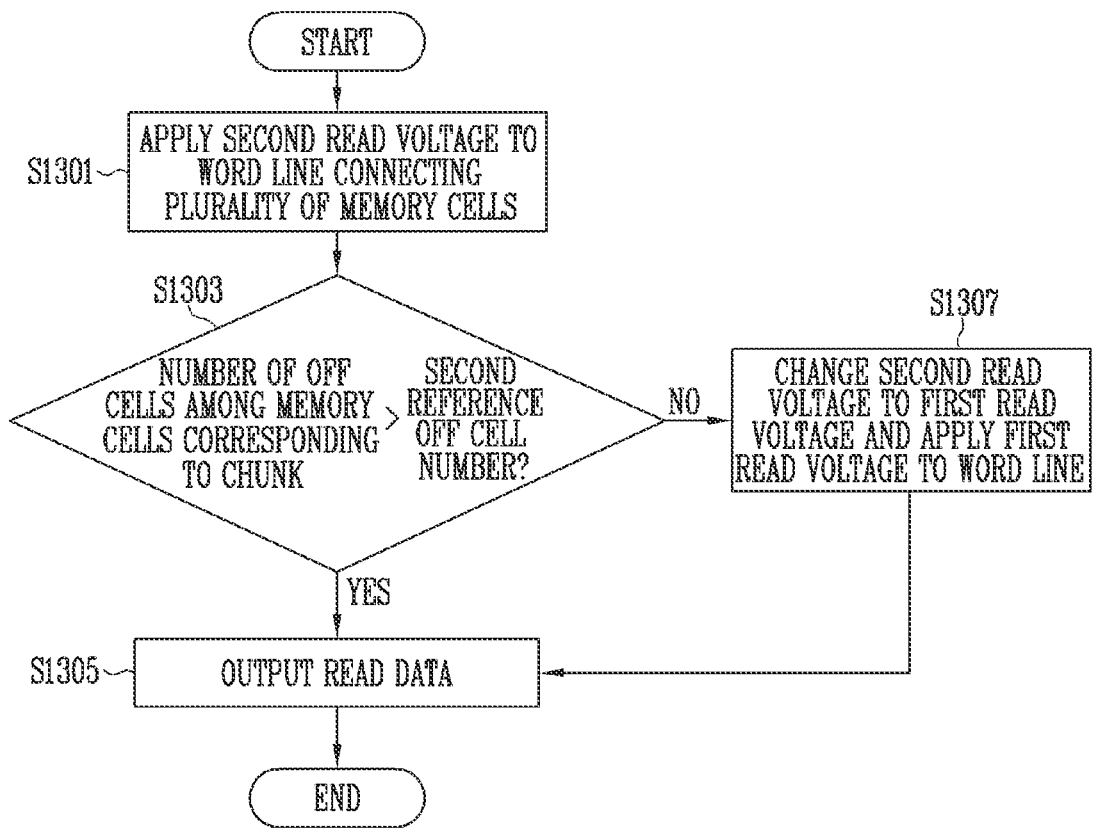
FIG. 13 is a flowchart illustrating another example of a method of changing a second read voltage to a first read voltage according to an embodiment of the present disclosure.

FIG. 13 is a flowchart illustrating another example of a method of changing a second read voltage to a first read voltage according to an embodiment of the present disclosure.

The method shown in FIG. 13 may be performed, for example, by the memory device 100 shown in FIG. 1.

Referring to FIG. 13, in step S1301, the memory device 100 may apply the second read voltage to the word line that connects the plurality of memory cells. For example, the operation controller 140 may store the data that is read by applying the second read voltage to the plurality of memory cells in the read data storage 142.

In step S1303, the memory device 100 may determine whether the number of off cells of the memory cells that correspond to the chunk among the plurality of memory cells to which the second read voltage is applied exceeds the second reference off cell number. For example, when the number of off cells among the memory cells that correspond to the chunk exceeds the second reference off cell number, step S1305 may be performed. Alternatively, when the number of off cells among the memory cells that correspond to the chunk is equal to or less than the second reference off cell number, step S1307 may be performed.

In step S1305, the memory device 100 may output the data that is read by applying the second read voltage to the plurality of memory cells to the memory controller 200.

In step S1307, when the number of off cells among the memory cells that correspond to the chunk is equal to or less than the second reference off cell number, the memory device 100 may change the second read voltage to the first read voltage and may apply the first read voltage to the word line. Thereafter, the memory device 100 may output the data that is read by applying the first read voltage to the plurality of memory cells to the memory controller 200.

Figure 14:
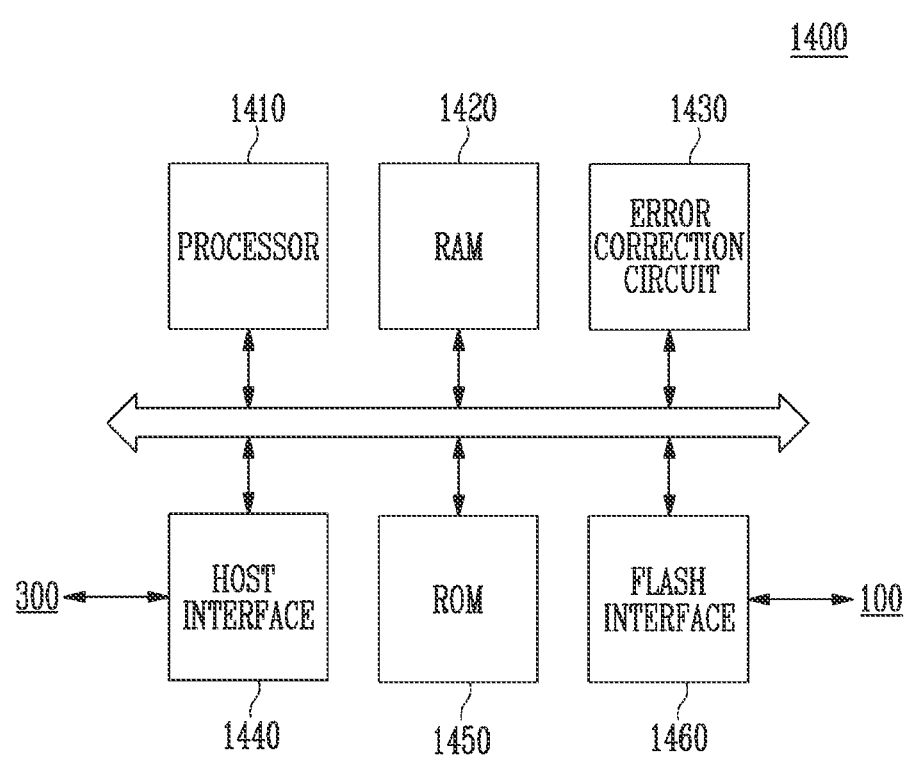
FIG. 14 is a diagram illustrating a memory controller of FIG. 1.

FIG. 14 is a diagram illustrating the memory controller of FIG. 1.

The memory controller 1400 of FIG. 14 may represent the memory controller 200 of FIG. 1.

Referring to FIG. 14, the memory controller 1400 may include a processor 1430, a RAM 1420, an error correction circuit 1430, a host interface 1440, a ROM 1450, and a flash interface 1460.

The processor 1410 may control an overall operation of the memory controller 1400. The RAM 1420 may be used as a buffer memory, a cache memory, an operation memory, and the like of the memory controller 1400.

The error correction circuit 1430 may perform error correction. The error correction circuit 1430 may perform error correction encoding (ECC encoding) based on data to be written to the memory device through the flash interface 1460. The error correction encoded data may be transferred to the memory device through the flash interface 1460. The error correction circuit 1430 may perform error correction decoding (ECC decoding) on data that is received from the memory device 100 through the flash interface 1460. For example, the error correction circuit 1430 may be included in the flash interface 1460 as a component of the flash interface 1460.

The ROM 1450 may store various information that is required for the memory controller 1400 to operate in a firmware form.

The memory controller 1400 may communicate with an external device (for example, the host 300, an application processor, and the like) through the host interface 1440.

The memory controller 1400 may communicate with the memory device 100 through the flash interface 1460. The memory controller 1400 may transmit the command, the address, the control signal, and the like to the memory device 100 and receive the data through the flash interface 1460. For example, the flash interface 1460 may include a NAND interface, FIG. 15 is a block diagram illustrating a memory card system to which a memory system according to an embodiment of the present disclosure is applied.

Figure 15:
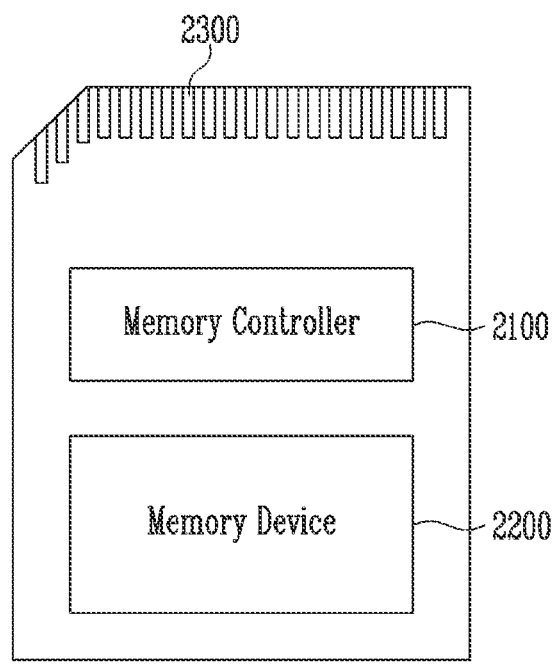
FIG. 15 is a block diagram illustrating a memory card system to which a memory system according to an embodiment of the present disclosure is applied.

Referring to FIG. 15, the memory card system 2000 includes a memory controller 2100, a memory device 2200, and a connector 2300.

The memory controller 2100 may be connected to the memory device 2200. The memory controller 2100 may be configured to access the memory device 2200. For example, the memory controller 2100 may be configured to control read, write, erase, and background operations of the memory device 2200. The memory controller 2100 may be configured to provide an interface between the memory device 2200 and a host. The memory controller 2100 may be configured to drive firmware for controlling the memory device 2200. The memory controller 2100 may be implemented identically to the memory controller 200 described with reference to FIG. 1. The memory device 2200 may be implemented identically to the memory device 100 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 may be configured to communicate with an external device through at least one of various communication standards, such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 16:
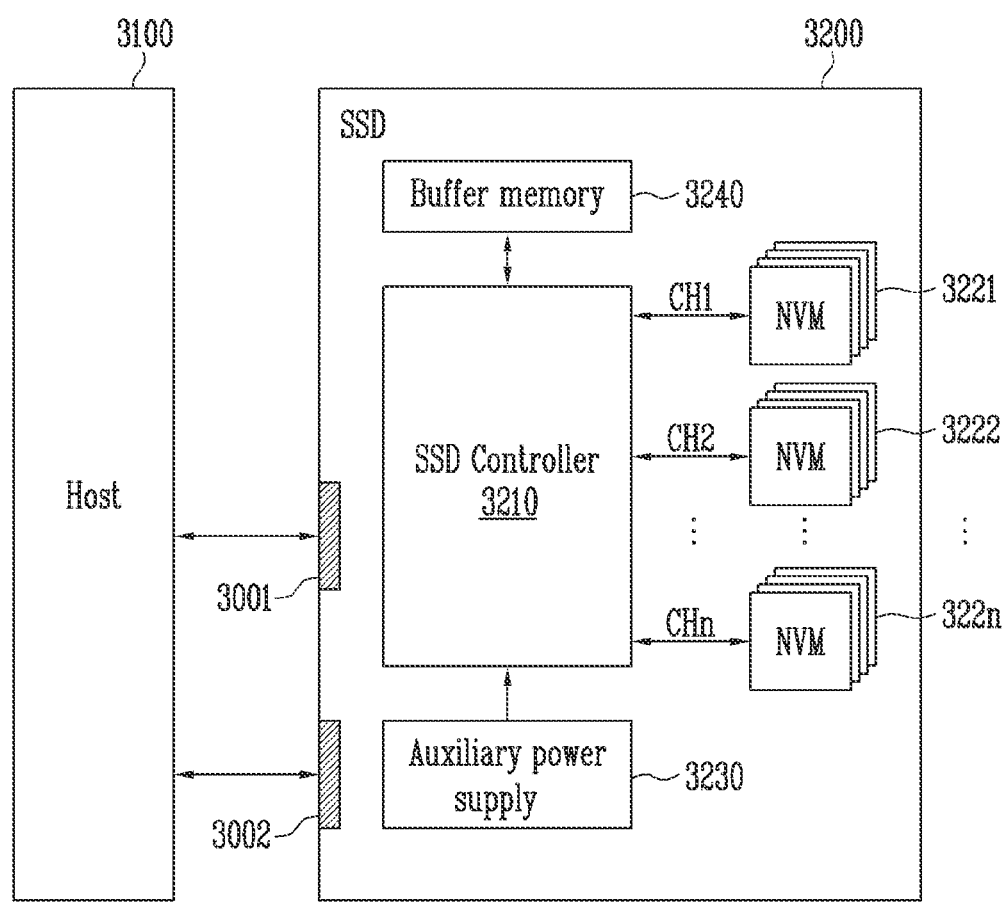
FIG. 16 is a block diagram illustrating a solid state drive (SSD) system to which a memory system according to an embodiment of the present disclosure is applied.

FIG. 16 is a block diagram illustrating a solid state drive (SSD) system to which a memory system according to an embodiment of the present disclosure is applied.

Referring to FIG. 16, the SSD system 3000 may include a host 3100 and an SSD 3200. The SSD 3200 may exchange a signal with the host 3100 through a signal connector 3001 and may receive power through a power connector 3002. The SSD 3200 may include an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200, described with reference to FIG. 1.

The SSD controller 3210 may control the plurality of flash memories 3221 to 322n in response to the signal received from the host 3100. For example, the signal may be signals based on an interface between the host 3100 and the SSD 3200. For example, the signal may be a signal that is defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 may be connected to the host 3100 through the power connector 3002. The auxiliary power device 3230 may receive the power from the host 3100 and may charge the power. The auxiliary power device 3230 may provide power for the SSD 3200 when power supply from the host 3100 is not smooth. For example, the auxiliary power device 3230 may be positioned in the SSD 3200 or may be positioned outside of the SSD 3200. For example, the auxiliary power device 3230 may be positioned on a main board and may provide auxiliary power to the SSD 3200.

The buffer memory 3240 may operate as a buffer memory of the SSD 3200. For example, the buffer memory 3240 may temporarily store data that is received from the host 3100 or data that is received from the plurality of flash memories 3221 to 322n, or may temporarily store meta data (for example, a mapping table) of the flash memories 3221 to 322n. The buffer memory 3240 may include a volatile memory, such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 17:
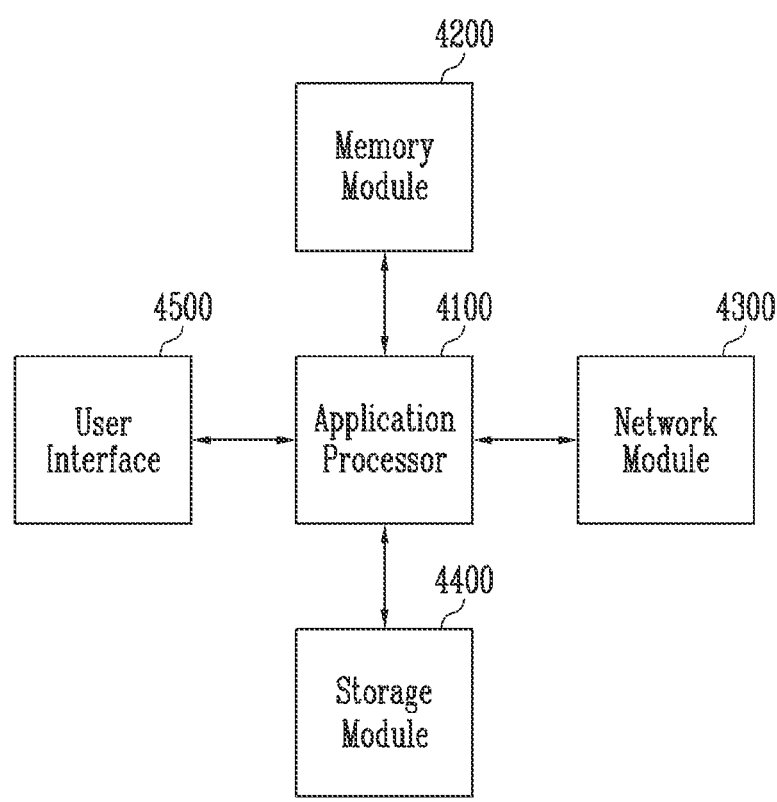
FIG. 17 is a block diagram illustrating a user system to which a memory system according to an embodiment of the present disclosure is applied.

FIG. 17 is a block diagram illustrating a user system to which a memory system according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like that are included in the user system 4000. For example, the application processor 4100 may include controllers, interfaces, graphics engines, and the like that control the components that are included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory, such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication, such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data that is received from the application processor 4100. Alternatively, the storage module 4400 may transmit data that is stored in the storage module 4400 to the application processor 4100. For example, the storage module 4400 may be implemented as a nonvolatile semiconductor memory element, such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the memory system 50, described with reference to FIG. 1.

The user interface 4500 may include interfaces for inputting data or an instruction to the application processor 4100 or for outputting data to an external device. For example, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
    a plurality of memory cells connected to a word line;
    an operation controller configured to apply a first read voltage or a second read voltage to the word line and configured to obtain data that is stored in the plurality of memory cells through bit lines that are respectively connected to the plurality of memory cells, wherein the second read voltage is higher than the first read voltage; and
    a read voltage controller configured to control the operation controller to read the data that is stored in the plurality of memory cells by using the second read voltage and control the operation controller to read the data that is stored in the plurality of memory cells by using the first read voltage according to the number of off cells that are counted based on the data that is read by using the second read voltage, in response to a read command that provides instruction to read the data that is stored in the plurality of memory cells that are input from an external controller.

2. The memory device of claim 1, wherein each of the plurality of memory cells is programmed to store a plurality of bits, and
    wherein the data that is stored in the plurality of memory cells includes a plurality of logical pages.

3. The memory device of claim 2, wherein the second read voltage is a voltage for reading a logical page among the plurality of logical pages.

4. The memory device of claim 3, wherein the logical page is a least significant bit page.

5. The memory device of claim 1, wherein the read voltage controller comprises:
    a cell counter configured to count the number of off cells;
    a read voltage code storage configured to store information regarding a reference off cell number; and
    a voltage change controller configured to control the operation controller to change the second read voltage to the first read voltage based on the number of off cells that are counted and the information regarding the reference off cell number.

6. The memory device of claim 5, wherein the operation controller further comprises:
a voltage generator configured to generate the first read voltage or the second read voltage; and
a read data storage configured to store the data that is read by using the second read voltage.

7. The memory device of claim 6, wherein the information regarding the reference off cell number includes a first reference off cell number and a second reference off cell number, the second reference off cell number being less than the first reference off cell number, and
wherein, when the number of off cells is equal to or less than the first reference off cell number, the voltage change controller is configured to control the operation controller to change the second read voltage to the first read voltage and configured to read the data that is stored in the plurality of memory cells by using the first read voltage.

8. The memory device of claim 5, wherein the data that is read by using the second read voltage includes a plurality of data chunks, and
wherein the cell counter is configured to count the number of off cells of memory cells corresponding to any one data chunk among the plurality of data chunks.

9. The memory device of claim 8, wherein the information regarding the reference off cell number includes a first reference off cell number and a second reference off cell number, the second reference off cell number being less than the first reference off cell number, and
wherein, when the number of off cells of the memory cells that correspond to any one data chunk among the plurality of data chunks is equal to or less than the second reference off cell number, the operation controller is controlled to change the second read voltage to the first read voltage and is configured to read the data that is stored in the plurality of memory cells by using the first read voltage.

10. A memory device comprising:
a plurality of memory cells connected to a word line;
an operation controller configured to perform a program operation that stores multi-page data, each including a plurality of bits in the plurality of memory cells, and configured to perform a read operation that obtains the multi-page data that is stored in the plurality of memory cells, the program operation including a first program step and a second program step, the multi-page data including a plurality of logical pages; and
a read voltage controller configured to control the operation controller to determine whether a program step Is performed up to the first program step or the second program step on the plurality of memory cells based on the number of 0s or 1s that are included in sensing data that is obtained by sensing data that is stored in the plurality of memory cells by using a second read voltage, in response to a read command that provides instruction to read a logical page among the plurality of logical pages, and configured to sense the data that is stored in the plurality of memory cells by using a first read voltage with a voltage that is lower than the second read voltage when a program step of the plurality of memory cells is the first program step.

11. The memory device of claim 10, wherein, in the first program step, threshold voltages of the plurality of memory cells are increased to a threshold voltage that corresponds to each of an erase state and an intermediate state.

12. The memory device of claim 11, wherein, in the second program step, the threshold voltage of the plurality of memory cells, among the threshold voltages of the plurality of memory cells on which the first program step is performed, corresponding to the erase state, is increased to a threshold voltage that corresponds to each of the erase state and a first program state to a third program state, and the threshold voltage of the plurality of memory cells that corresponds to the intermediate state is increased to a threshold voltage that corresponds to a fourth program state to a seventh program state.

13. The memory device of claim 12, wherein the logical page is a least significant bit page.

14. The memory device of claim 10, wherein, when the number of 0s or 1s that are included in the sensing data is equal to or less than a first reference number, the read voltage controller is configured to determine that the program step is performed up to the first program step on the plurality of memory cells.

15. The memory device of claim 10, wherein the sensing data includes a plurality of data chunks, and
wherein, when the number of 0s or 1s that are included in sensing data that corresponds to a chunk among the plurality of data chunks is equal to or less than a second reference number, the read voltage controller is configured to determine that the program step is performed up to the first program step on the plurality of memory cells.

16. A method of operating a memory device for reading data that is stored in memory cells by using a first read voltage or a second read voltage, the method comprising:
reading the data that is stored in the memory cells by using the second read voltage;
counting the number of off cells among the memory cells by using the second read voltage; and
reading the data that is stored in the memory cells by using the first read voltage with a voltage that is lower than the second read voltage based on the number of off cells that are counted.

17. The method of claim 16, wherein each of the memory cells is programmed to store a plurality of bits, and
wherein the data that is stored in the memory cells includes a plurality of logical pages.

18. The method of claim 17, wherein the second read voltage is for reading a logical page among the plurality of logical pages.

19. The method of claim 18, wherein reading the data that is stored in the memory cells by using the first read voltage comprises reading the data that is stored in the memory cells by using the first read voltage in response to the number of off cells being equal to or less than a reference off cell number.

20. The method of claim 19, where in the number of off cells is the number of off cells of memory cells that correspond to a chunk among the memory cells to which the second read voltage is applied.

* * * * *